US008401598B2

(12) United States Patent
Rofougaran et al.

(10) Patent No.: US 8,401,598 B2
(45) Date of Patent: Mar. 19, 2013

(54) METHOD AND SYSTEM FOR CHIP TO CHIP COMMUNICATION UTILIZING SELECTABLE DIRECTIONAL ANTENNAS

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 670 days.

(21) Appl. No.: 12/463,726

(22) Filed: May 11, 2009

(65) Prior Publication Data

US 2010/0285745 A1    Nov. 11, 2010

(51) Int. Cl.
    *H04M 1/00*    (2006.01)
(52) U.S. Cl. ...... 455/575.5; 455/75; 455/88; 455/562.1; 455/575.1; 455/129; 375/146; 375/150; 343/700 R
(58) Field of Classification Search ............ 455/75, 455/73, 88, 91, 562.1, 575.7, 575.5, 276.1, 455/121, 129, 11.1, 90.3, 425, 41.1, 41.2, 455/66.1; 375/146, 147, 105, 267; 343/793, 343/700 R
See application file for complete search history.

(56) References Cited

U.S. PATENT DOCUMENTS

| 5,715,274 | A | 2/1998 | Rostoker et al. | |
|---|---|---|---|---|
| 5,945,817 | A | 8/1999 | Nguyen | |
| 6,542,720 | B1 | 4/2003 | Tandy | |
| 6,584,080 | B1 * | 6/2003 | Ganz et al. | 370/315 |
| 6,732,301 | B1 | 5/2004 | Landry et al. | |
| 6,842,144 | B2 | 1/2005 | Guo et al. | |
| 7,330,702 | B2 * | 2/2008 | Chen et al. | 455/73 |
| 7,346,788 | B2 | 3/2008 | Chase | |
| 2002/0106996 | A1 | 8/2002 | Stengl et al. | |
| 2004/0242167 | A1 * | 12/2004 | Gambuzza | 455/83 |
| 2006/0211449 | A1 | 9/2006 | Haque et al. | |
| 2006/0291598 | A1 * | 12/2006 | Gebara et al. | 375/346 |
| 2007/0121947 | A1 * | 5/2007 | Sood et al. | 380/277 |
| 2007/0207734 | A1 * | 9/2007 | Briere | 455/41.2 |
| 2008/0125041 | A1 * | 5/2008 | Angelhag et al. | 455/41.2 |

(Continued)

FOREIGN PATENT DOCUMENTS

EP    1939979    7/2008

OTHER PUBLICATIONS

Haridas, N et al., "Adaptive Micro-Antenna on Silicon Substrate", Adaptive Hardware and Systems, 2006, AHS 2006, First NSDS/ESA Conference on Istanbul, Turkey Jun. 15-18, 2006, Piscataway, NJ, USA, IEEE LNKD-DOI:10.1109/AHS.2006.15, Jun. 15, 2006, pp. 43-50, XP010920164.

(Continued)

*Primary Examiner* — Shaima Q Aminzay
(74) *Attorney, Agent, or Firm* — Farjami & Farjami LLP

(57) ABSTRACT

A wireless device comprising a plurality of chips may be operable to wirelessly communicate information between a plurality of chips via selectable directional antennas. Each of the chips may comprise one or more transmitters and receivers, and one or more integrated directional antennas communicatively coupled to the transmitters and/or receivers. The directional antennas may include patch antennas that may be configured to transmit signals in the direction of another chip intended to receive the transmitted signals. The patch antennas may be configured to transmit signals at a frequency matching a configured frequency of a directional antenna integrated on another of the plurality of chips intended to receive the transmitted signals. The directional antennas may include dipole antennas. The inter-chip communication may include baseband signals, radio frequency signals, and/or intermediate frequency signals. The plurality of chips may be integrated on a single package or on a plurality of packages.

20 Claims, 6 Drawing Sheets

U.S. PATENT DOCUMENTS

| | | |
|---|---|---|
| 2008/0139120 A1 | 6/2008 | Chase |
| 2008/0204338 A1 | 8/2008 | Rofougaran |
| 2009/0008753 A1* | 1/2009 | Rofougaran .................. 257/660 |
| 2009/0102927 A1* | 4/2009 | Tatsuta et al. ................. 348/192 |
| 2010/0297954 A1* | 11/2010 | Rofougaran et al. ........... 455/73 |
| 2010/0297963 A1* | 11/2010 | Rofougaran et al. ........... 455/88 |

OTHER PUBLICATIONS

Brewer J E et al: "Integrated Anennas on Silicon Substrates for Communication Over Free Space," IEEE Electron Device Letters, IEEE Service Center, New York, NY, US LNKD-DOI:10.1109/LED. 2004.824837, vol. 25, No. 4, Apr. 1, 2004, pp. 196-198, XP011109655.

Akira Matsuzawa ED—Eisenreich H et al: "A new direction in integrated circuit technology," Circuits and Systems, 2007. MWSCAS 2007. 50th Midwest Symposium on, IEEE, Piscataway, NJ, USA, Aug. 5, 2007, pp. 1550-1551, XP031243419.

EPO Communication dated Jul. 23, 2010 in Application No. 10003955.1-2220.

* cited by examiner

METHOD AND SYSTEM FOR CHIP TO CHIP COMMUNICATION UTILIZING SELECTABLE DIRECTIONAL ANTENNAS

CROSS-REFERENCE TO RELATED APPLICATIONS/INCORPORATION BY REFERENCE

This application makes reference to:
U.S. patent application Ser. No. 12/469,247 filed on May 20, 2009; and
U.S. patent application Ser. No. 12/469,231 filed on May 20, 2009.

Each of the above stated applications is hereby incorporated herein by reference in its entirety.

FIELD OF THE INVENTION

Certain embodiments of the invention relate to wireless communication. More specifically, certain embodiments of the invention relate to a method and system for chip to chip communication utilizing selectable directional antennas.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for chip to chip communication utilizing selectable directional antennas, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for chip to chip communication utilizing selectable directional antennas. In various exemplary aspects of the invention, in a wireless device comprising a plurality of chips, where each of the plurality of chips may comprise one or more transmitters, one or more receivers, and one or more integrated directional antennas communicatively coupled to the one or more transmitters and/or the one or more receivers, wireless communication of information occurs between two or more of the plurality of chips via the directional antennas. The directional antennas may comprise patch antennas that may be configured to transmit signals in the direction of another chip intended to receive the transmitted signals. The patch antennas may be configured to transmit signals at a frequency matching a configured frequency of a directional antenna integrated on another of the plurality of chips intended to receive the transmitted signals. The directional antennas may comprise dipole antennas. The inter-chip communication may comprise communication of baseband signals, radio frequency signals, and/or intermediate frequency signals. The plurality of chips may be integrated on a single package or on a plurality of packages.

Figure 1:
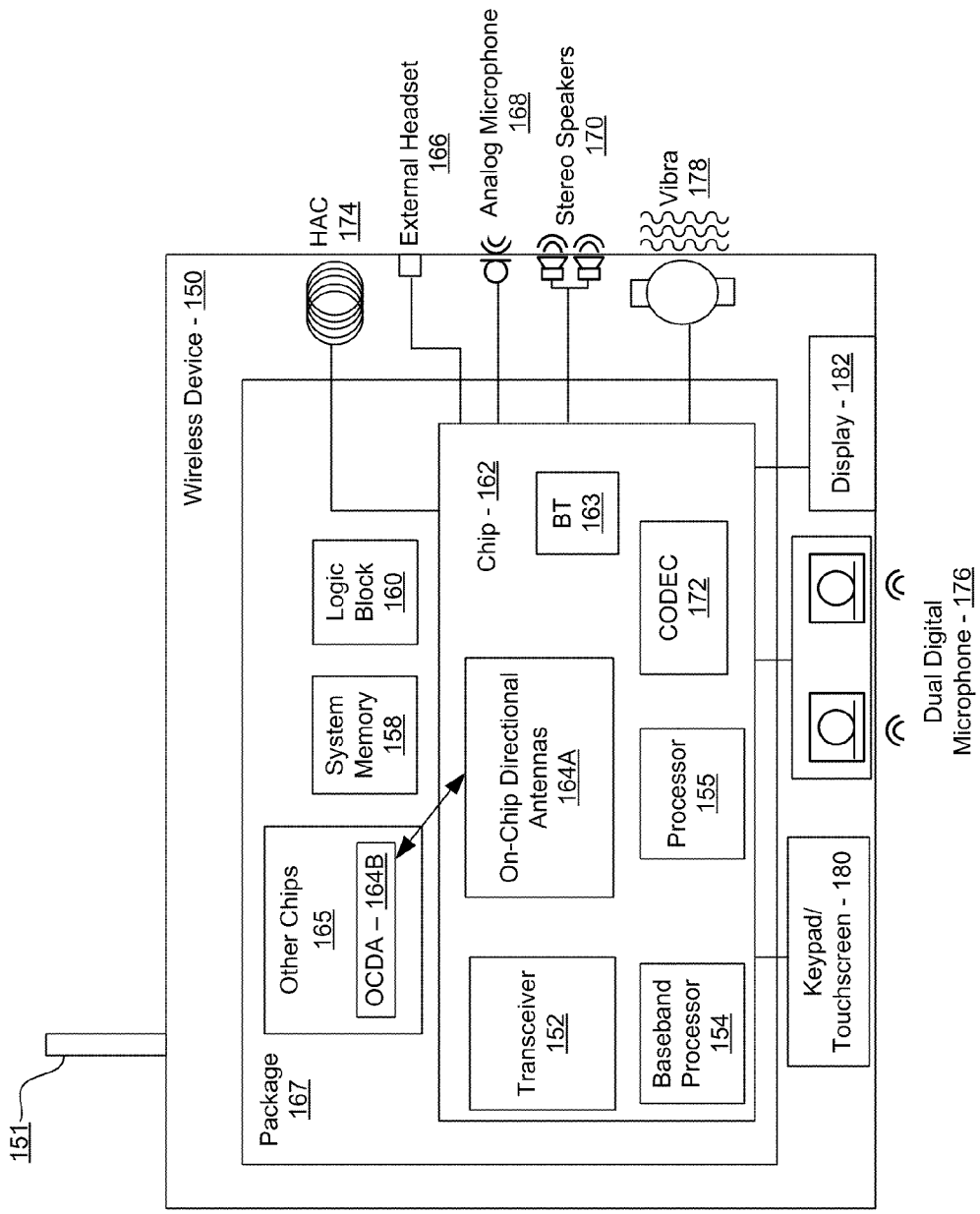
FIG. 1 is a block diagram of an exemplary wireless system, which may be utilized in accordance with an embodiment of the invention.

FIG. 1 is a block diagram of an exemplary wireless system, which may be utilized in accordance with an embodiment of the invention. Referring to FIG. 1, the wireless device 150 may comprise an antenna 151, a transceiver 152, a baseband processor 154, a processor 156, a system memory 158, a logic block 160, a chip 162, on-chip directional antennas 164, other chips 154, an external headset port 166, and a package 167. The wireless device 150 may also comprise an analog microphone 168, integrated hands-free (IHF) stereo speakers 170, a hearing aid compatible (HAC) coil 174, a dual digital microphone 176, a vibration transducer 178, a keypad and/or touchscreen 180, and a display 182.

The transceiver 152 may comprise suitable logic, circuitry, interfaces, and/or code that may be enabled to modulate and upconvert baseband signals to RF signals for transmission by one or more antennas, which may be represented generically by the antenna 151. The transceiver 152 may also be enabled to downconvert and demodulate received RF signals to baseband signals. The RF signals may be received by one or more antennas, which may be represented generically by the antenna 151. Different wireless systems may use different antennas for transmission and reception. The transceiver 152 may be enabled to execute other functions, for example, filtering the baseband and/or RF signals, and/or amplifying the baseband and/or RF signals. Although a single transceiver 152 is shown, the invention is not so limited. Accordingly, the transceiver 152 may be implemented as a separate transmitter and a separate receiver. In addition, there may be a plurality of transceivers, transmitters and/or receivers. In this regard, the plurality of transceivers, transmitters and/or receivers may enable the wireless device 150 to handle a plurality of wireless protocols and/or standards including cellular, WLAN and PAN. Wireless technologies handled by the wireless device 150 may comprise GSM, CDMA, CDMA2000, WCDMA, GMS, GPRS, EDGE, WIMAX, WLAN, LTE, 3GPP, UMTS, BLUETOOTH, and ZIGBEE, for example.

The baseband processor 154 may comprise suitable logic, circuitry, interfaces, and/or code that may be enabled to process baseband signals for transmission via the transceiver 152 and/or the baseband signals received from the transceiver 152. The processor 156 may be any suitable processor or controller such as a CPU, DSP, ARM, or any type of integrated circuit processor. The processor 156 may comprise suitable logic, circuitry, and/or code that may be enabled to control the operations of the transceiver 152 and/or the baseband processor 154. For example, the processor 156 may be utilized to update and/or modify programmable parameters and/or values in a plurality of components, devices, and/or processing elements in the transceiver 152 and/or the baseband processor 154. At least a portion of the programmable parameters may be stored in the system memory 158.

Control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The system memory 158 may comprise suitable logic, circuitry, interfaces, and/or code that may be enabled to store a plurality of control and/or data information, including parameters needed to calculate frequencies and/or gain, and/or the frequency value and/or gain value. The system memory 158 may store at least a portion of the programmable parameters that may be manipulated by the processor 156.

The logic block 160 may comprise suitable logic, circuitry, interfaces, and/or code that may enable controlling of various functionalities of the wireless device 150. For example, the logic block 160 may comprise one or more state machines that may generate signals to control the transceiver 152 and/or the baseband processor 154. The logic block 160 may also comprise registers that may hold data for controlling, for example, the transceiver 152 and/or the baseband processor 154. The logic block 160 may also generate and/or store status information that may be read by, for example, the processor 156. Amplifier gains and/or filtering characteristics, for example, may be controlled by the logic block 160.

The BT radio/processor 163 may comprise suitable circuitry, logic, interfaces, and/or code that may enable transmission and reception of Bluetooth signals. The BT radio/processor 163 may enable processing and/or handling of BT baseband signals. In this regard, the BT radio/processor 163 may process or handle BT signals received and/or BT signals transmitted via a wireless communication medium. The BT radio/processor 163 may also provide control and/or feedback information to/from the baseband processor 154 and/or the processor 156, based on information from the processed BT signals. The BT radio/processor 163 may communicate information and/or data from the processed BT signals to the processor 156 and/or to the system memory 158. Moreover, the BT radio/processor 163 may receive information from the processor 156 and/or the system memory 158, which may be processed and transmitted via the wireless communication medium a Bluetooth headset, for example.

The CODEC 172 may comprise suitable circuitry, logic, interfaces, and/or code that may process audio signals received from and/or communicated to input/output devices. The input devices may be within or communicatively coupled to the wireless device 150, and may comprise the analog microphone 168, the stereo speakers 170, the hearing aid compatible (HAC) coil 174, the dual digital microphone 176, and the vibration transducer 178, for example. The CODEC 172 may be operable to up-convert and/or down-convert signal frequencies to desired frequencies for processing and/or transmission via an output device. The CODEC 172 may enable utilizing a plurality of digital audio inputs, such as 16 or 18-bit inputs, for example. The CODEC 172 may also enable utilizing a plurality of data sampling rate inputs. For example, the CODEC 172 may accept digital audio signals at sampling rates such as 8 kHz, 11.025 kHz, 12 kHz, 16 kHz, 22.05 kHz, 24 kHz, 32 kHz, 44.1 kHz, and/or 48 kHz. The CODEC 172 may also support mixing of a plurality of audio sources. For example, the CODEC 172 may support audio sources such as general audio, polyphonic ringer, $I^2S$ FM audio, vibration driving signals, and voice. In this regard, the general audio and polyphonic ringer sources may support the plurality of sampling rates that the audio CODEC 172 is enabled to accept, while the voice source may support a portion of the plurality of sampling rates, such as 8 kHz and 16 kHz, for example.

The CODEC 172 may utilize a programmable infinite impulse response (IIR) filter and/or a programmable finite impulse response (FIR) filter for at least a portion of the audio sources to compensate for passband amplitude and phase fluctuation for different output devices. In this regard, filter coefficients may be configured or programmed dynamically based on current operations. Moreover, the filter coefficients may be switched in one-shot or may be switched sequentially, for example. The CODEC 172 may also utilize a modulator, such as a Delta-Sigma ($\Delta$-$\Sigma$) modulator, for example, to code digital output signals for analog processing.

The chip 162 may comprise an integrated circuit with multiple functional blocks integrated within, such as the transceiver 152, the processor 156, the baseband processor 154, the BT radio/processor 163, the on-chip directional antennas 164A and 164B, and the CODEC 172. The number of functional blocks integrated in the chip 162 is not limited to the number shown in FIG. 1. Accordingly, any number of blocks may be integrated on the chip 162 depending on chip space and wireless device 150 requirements, for example. In another embodiment of the invention, portions of the circuitry in the wireless device 150 may be integrated on the other chips 165, such as the CODEC 172, the processor 155, the baseband processor 154, and/or the BT radio/processor 163. The other chips 165 may also comprise on-chip directional antennas 164B.

The on-chip directional antennas 164A and 164B may comprise metallic layers deposited on and/or integrated in the chip 162 and/or the other chips 165 and may be operable to emit electromagnetic radiation in a desired direction, depending on the geometry of the particular antenna being activated. In addition, the on-chip directional antennas 164A may comprise patch antennas that may be operable to emit EM signals at configurable frequencies. In this manner, antennas on various chips in the wireless device 150 may communicate at different wavelengths depending on which chips need to communicate at a particular time.

The external headset port 166 may comprise a physical connection for an external headset to be communicatively coupled to the wireless device 150. The analog microphone 168 may comprise suitable circuitry, logic, and/or code that may detect sound waves and convert them to electrical signals via a piezoelectric effect, for example. The electrical signals generated by the analog microphone 168 may comprise analog signals that may require analog to digital conversion before processing.

The package 167 may comprise a printed circuit board or other support structure for the chip 162, the other chips 165, and other components of the wireless device 150. The package 167 may comprise an insulating material, for example, and may provide isolation between electrical components mounted on the package 167. In another embodiment of the invention, the chip 162 and the other chips 165 may be integrated on a plurality of packages.

The stereo speakers 170 may comprise a pair of speakers that may be operable to generate audio signals from electrical signals received from the CODEC 172. The HAC coil 174 may comprise suitable circuitry, logic, and/or code that may enable communication between the wireless device 150 and a T-coil in a hearing aid, for example. In this manner, electrical audio signals may be communicated to a user that utilizes a hearing aid, without the need for generating sound signals via a speaker, such as the stereo speakers 170, and converting the generated sound signals back to electrical signals in a hearing aid, and subsequently back into amplified sound signals in the user's ear, for example.

The dual digital microphone 176 may comprise suitable circuitry, logic, and/or code that may be operable to detect sound waves and convert them to electrical signals. The electrical signals generated by the dual digital microphone 176 may comprise digital signals, and thus may not require analog to digital conversion prior to digital processing in the CODEC 172. The dual digital microphone 176 may enable beamforming capabilities, for example.

The vibration transducer 178 may comprise suitable circuitry, logic, and/or code that may enable notification of an incoming call, alerts and/or message to the wireless device 150 without the use of sound. The vibration transducer may generate vibrations that may be in synch with, for example, audio signals such as speech or music.

In operation, control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The CODEC 172 in the wireless device 150 may communicate with the processor 156 in order to transfer audio data and control signals. Control registers for the CODEC 172 may reside within the processor 156. The processor 156 may exchange audio signals and control information via the system memory 158. The CODEC 172 may up-convert and/or down-convert the frequencies of multiple audio sources for processing at a desired sampling rate.

The signals processed by the processor 155 and/or the baseband processor 154 may be communicated to and/or from devices in circuitry in the chip 162 and the other chips 165. Directional antennas, such as the on-chip directional antennas 164A and 164B may be utilized to direct signals at appropriate chips intended to receive particular signals. By utilizing wireless signals as opposed to wire traces between chips, which may comprise significant stray impedances that reduce the maximum data transfer rate, higher signal communication bandwidth may be achieved utilizing lower power.

Figure 2:
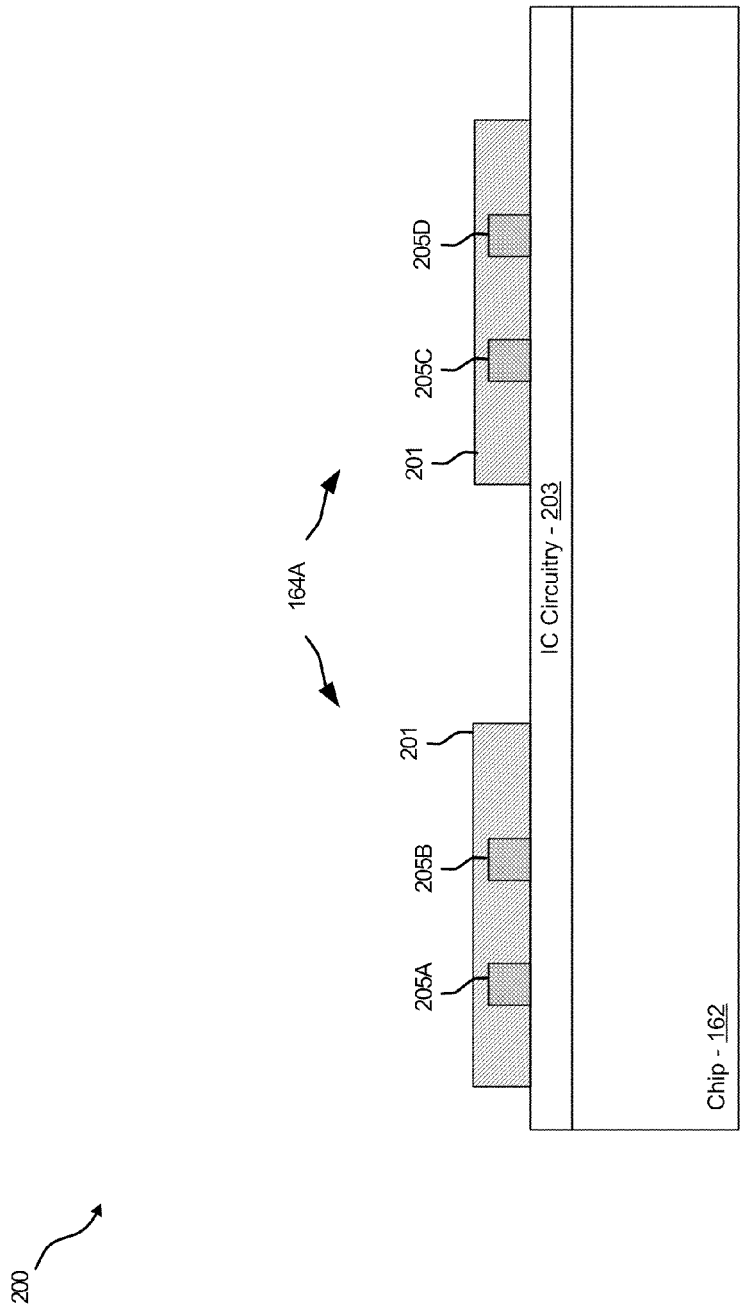
FIG. 2 is a block diagram illustrating exemplary on-chip directional antennas, in accordance with an embodiment of the invention.

FIG. 2 is a block diagram illustrating exemplary on-chip directional antennas, in accordance with an embodiment of the invention. Referring to FIG. 2, there is shown the on-chip directional antennas 164A integrated on the chip 162 comprising IC circuitry 203. The IC circuitry 203 may comprise various circuitry in the wireless device, as described with respect to FIG. 1.

The on-chip directional antennas 164A may comprise one or more conductive layers 201 deposited on and/or integrated in the chip 162 with the IC circuitry 203 and a plurality of antenna ports 205A-205D. The antenna ports 205A-205D may comprise conductive material and may enable electrical connectivity to the on-chip directional antennas 164A from other circuitry in the IC circuitry 203. In this manner, circuitry within the chip 162 may communicate with circuitry within other chips via the on-chip directional antennas 164A. The invention is not limited to the number of on-chip directional antennas 164A shown in FIG. 2. Accordingly, any number of on-chip directional antennas may be integrated depending on space requirements, and the number of directions communications may be desired. For example, on-chip directional antennas may be integrated at each edge of the chip 162 to enable communication with chips in each direction.

In operation, signals may be communicated between chips in the wireless device 150 via the on-chip directional antennas 164A, and on-chip directional antennas on other chips. For example, the antenna ports 205A-205D may enable the communication of signals to and/or from the on-chip directional antennas 164A. The signals may be directed at intended chips within the wireless device 150 utilizing beam forming by enabling antennas with a specific geometry for transmitting signals in a particular direction, as described further with respect to FIG. 3A-4.

In another embodiment of the invention, the on-chip directional antennas 164A may comprise configurable frequency of operation, such that chips that may be in the same direction of transmission from a particular chip may be selected by frequency of the transmitting and receiving on-chip directional antennas.

Figure 3A:
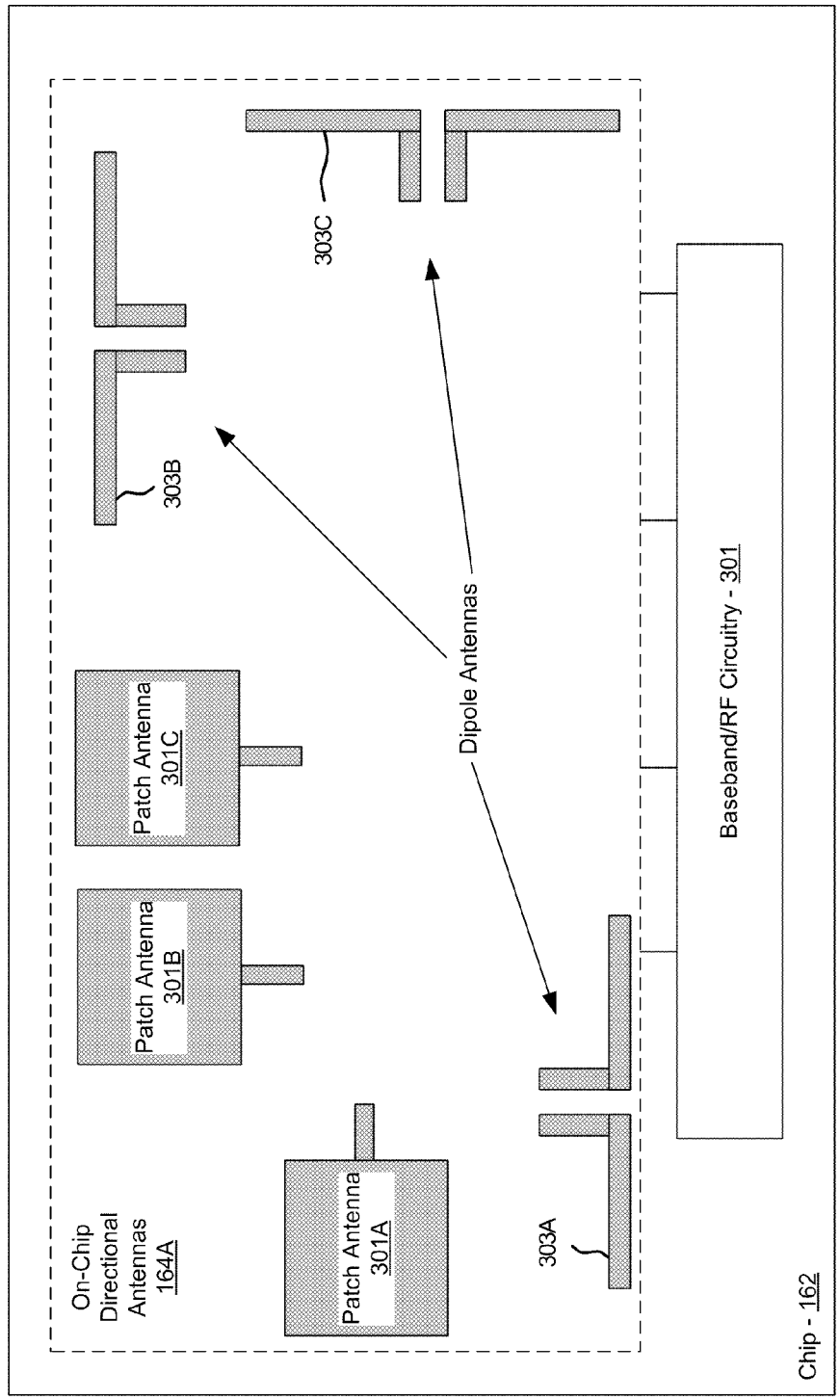
FIG. 3A is a diagram showing a top view of exemplary on-chip directional antennas, in accordance with an embodiment of the invention.

FIG. 3A is a diagram showing a top view of exemplary on-chip directional antennas, in accordance with an embodiment of the invention. Referring to FIG. 3, there is shown the chip 162 comprising the on-chip directional antennas 164A and baseband/RF circuitry 301.

The on-chip directional antennas 164A may comprise patch antennas 301A-301C and dipole antennas 303A and 303B, for example, but are not limited to these types of directional antennas. The patch antennas 301A-301C and dipole antennas 303A and 303B may be selectable by switches, such as CMOS switches, for example, in the baseband/RF circuitry 301. The antenna selected for communicating signals may be selected on the direction of the receiving chip from the chip 162. For example, if a receiving chip is located to the left of the chip 162, the patch antenna 301A may be selected to communicate the signals.

The baseband/RF circuitry 301 may comprise suitable circuitry, interfaces, logic, and/or code that may be operable to process baseband and RF signals. Baseband signals may be down-converted received RF signals, or may be generated by input devices such as microphones, for example. The baseband/RF circuitry 301 may comprise the transceiver 152, the baseband processor 154, the processor 156, the CODEC 172, and the BT radio/processor 163, for example, described with respect to FIG. 1.

In operation, signals may be communicated to and from the chip 162 via the patch antennas 301A-301C and dipole antennas 303A and 303B directed at other chips in the wireless device 150, such as the other chips 165. The direction of the receiving chip in relation to the chip 162 may determine which of the patch antennas 301A-301C and/or the dipole antennas 303A and 303B may be selected for communicating particular signals. In another embodiment of the invention, the frequency of the transmitted signals may also be configured to select specific chips to receive the signals. For example, two receiving chips that may be above the chip 162, in the plane of the drawing in FIG. 3A, such that the patch antenna 301A or 301B may be selected to communicate the signals, may receive signals from the same antenna, but at a different frequency. This may be accomplished by configuring the selectable on-chip antennas on the receiving chip to receive signals at a particular frequency.

Figure 3B:
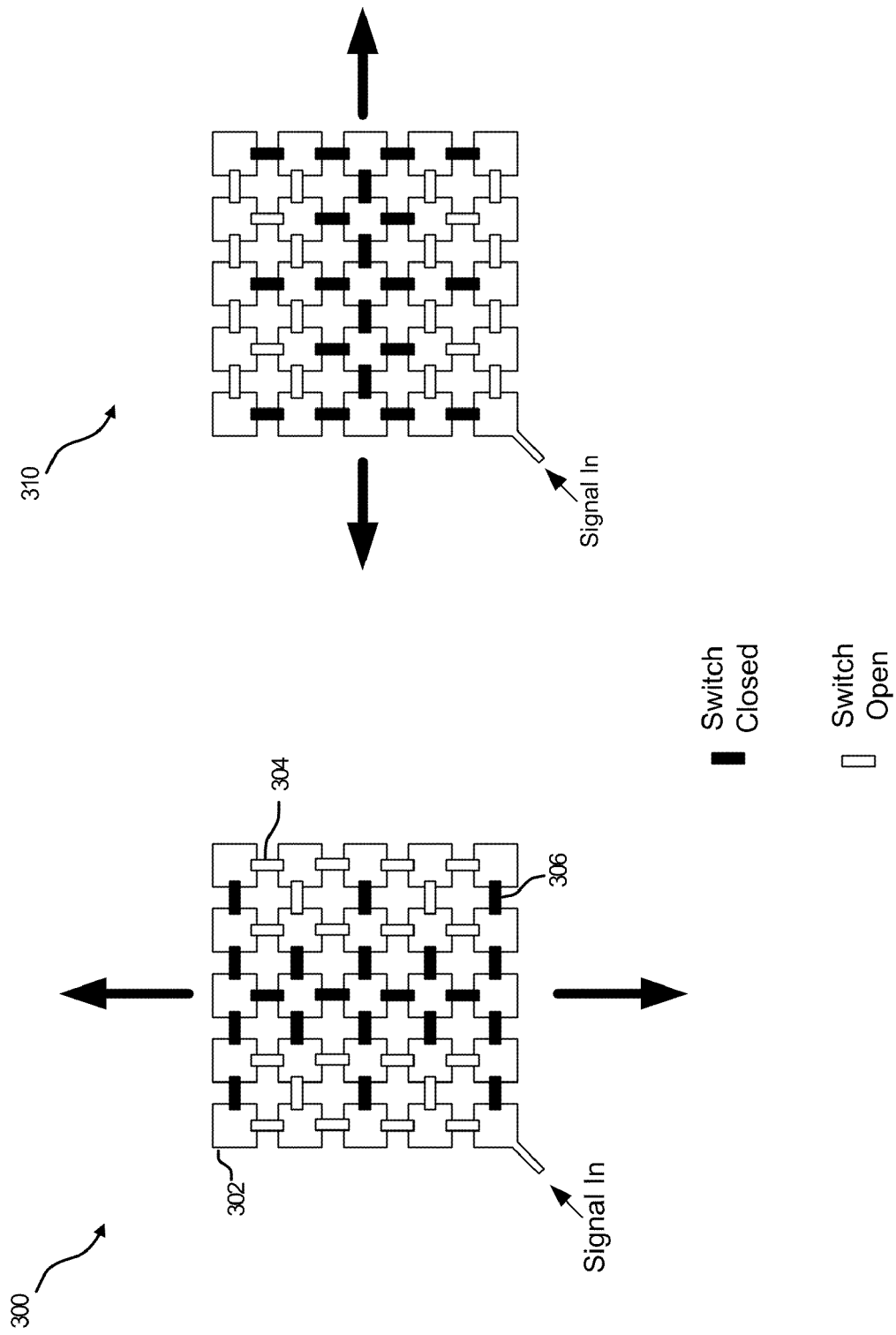
FIG. 3B is a diagram illustrating exemplary directional patch antennas, in accordance with an embodiment of the invention.

FIG. 3B is a diagram illustrating exemplary directional patch antennas, in accordance with an embodiment of the invention. Referring to FIG. 3B, there is shown patch antennas 300 and 310 comprising an array of pixel patches, such as the pixel patch 302, and switches, such as the switch 304. The number of pixel patches or switches per antenna is not limited by the number illustrated in FIG. 3B. The active area of the tunable antennas 300 and 310 may be adjusted by activating appropriate switches, as indicated by the switches which have been blackened, or closed, such as the switch 306, and open switches which are shown in FIG. 3B as white rectangles, such as the switch 304. In an embodiment of the invention, the patch antennas 300 and 310 may be integrated on or within the chip 162, described with respect to FIGS. 1, 2, and 3A.

In operation, the direction of transmission for the patch antennas 300 and 310 may be defined by the active patches, as indicated in FIG. 3B by closed switches, such as the switch 306. The active area may define a transmission radiation pattern with a maximum intensity in a desired direction as indicated by the large arrows from the top and bottom of patch antenna 300 and the sides of patch antenna 310, for example. The radiation patterns may be defined by a large variety of activated patch configurations and is not limited to those shown in FIG. 3B. In addition, the frequency of transmission may be controlled by activating appropriate switches in the tunable antennas 300 and/or 310, as described with respect to FIG. 3C.

Figure 3C:
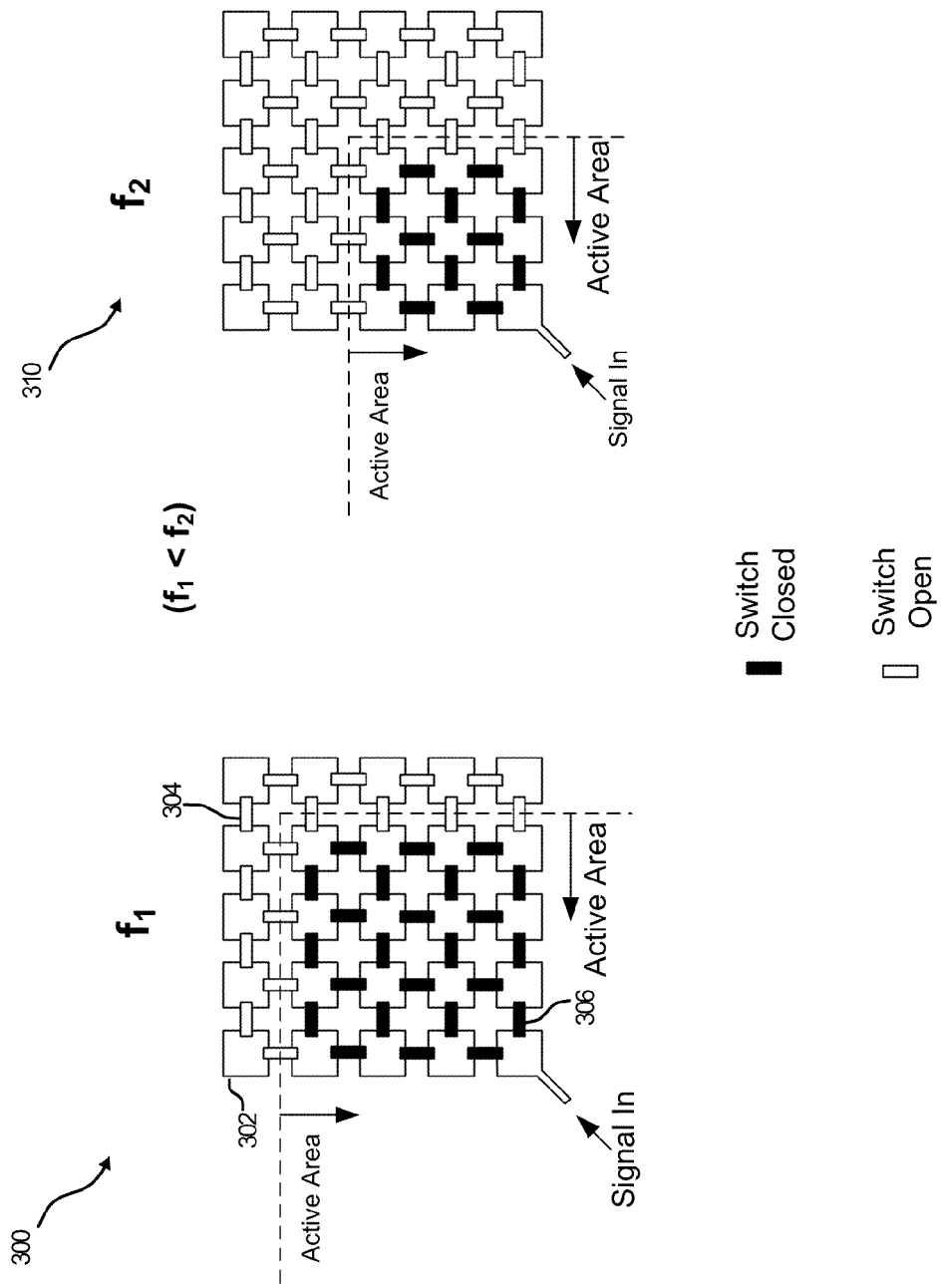
FIG. 3C is a block diagram illustrating exemplary patch antennas with configurable frequency, in accordance with an embodiment of the invention.

FIG. 3C is a block diagram illustrating exemplary patch antennas with configurable frequency, in accordance with an embodiment of the invention. Referring to FIG. 3C, there is shown patch antennas 300 and 310 each comprising an array of pixel patches, such as the pixel patch 302, and switches, such as the switch 304. The number of pixel patches or switches per antenna is not limited by the number illustrated in FIG. 3C. The active area of the patch antennas 300 and 310 may be adjusted by activating appropriate switches, as indicated by the switches which have been blackened (solid), or closed, such as the switch 306, and open switches which are shown in FIG. 3C as white rectangles, such as the switch 304. In an embodiment of the invention, the tunable antennas 300 and 310 may be integrated on or within the chip 162, described with respect to FIGS. 1, 2, and 3A.

In operation, the frequency range of transmission for the patch antennas 300 and 310 may be defined by the active area, as indicated in FIG. 3C by the area enclosed by the open switches, such as the switch 304. If the active area is reduced as illustrated in the patch antenna 310, the frequency of transmission may be greater than for the larger active area patch antenna 300. In addition, the polarization of the transmitted field and the beam shape may be controlled by activating appropriate switches in the patch antennas 300 and/or 310, as described with respect to FIG. 3B. In an embodiment of the invention, both the frequency and direction of transmission may be configured for communicating signals between chips in the wireless device 150. In this manner, signals may be communicated at very high frequency within the wireless device 150 without drawbacks with wire traces between chips due to stray impedances, for example.

Figure 4:
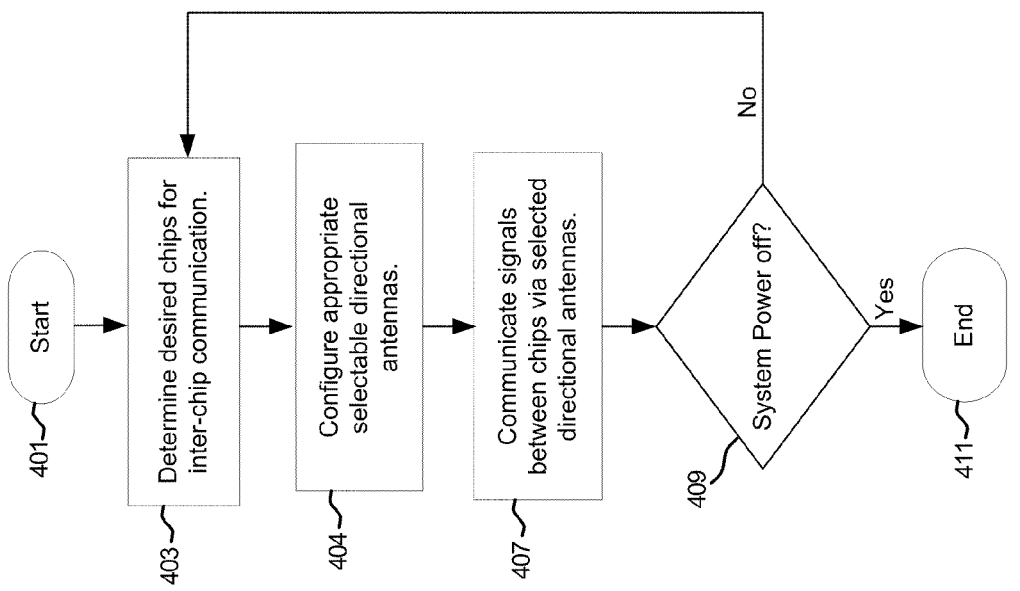
FIG. 4 is a block diagram illustrating exemplary steps for chip to chip communication using selectable on-chip directional antennas, in accordance with an embodiment of the invention.

FIG. 4 is a block diagram illustrating exemplary steps for chip to chip communication using selectable on-chip directional antennas, in accordance with an embodiment of the invention. Referring to FIG. 4, in step 403 after start step 401, the chips that are being communicated between may be selected. In step 405, the appropriate directional antennas on the selected chips may be configured to direct signals in the appropriate direction to enable communication between the chips, followed by step 407, where the signals may be communicated between the chips. If, in step 409, the wireless device 150 is to be powered down, the exemplary steps may proceed to end step 411, but if not the exemplary steps may return to step 403.

In an embodiment of the invention, a method and system are disclosed for enabling inter-chip wireless communication utilizing directional antennas integrated on each of the plurality of chips. In this regard, information may be communicated between two or more of the plurality of chips via the directional antennas. The directional antennas 164A, 164B, 301A-301C, and 303A-303C may comprise patch antennas 301A-301C that may be configured to transmit signals in the direction of another chip intended to receive the transmitted signals. The patch antennas 301A-301C may be configured to transmit signals at a frequency matching a configured frequency of a directional antenna integrated on another of the plurality of chips 162, 165 intended to receive the transmitted signals. The directional antennas 164A, 164B, and 303A-303C may comprise dipole antennas. The inter-chip communication may comprise baseband signals, radio frequency signals, and/or intermediate frequency signals. The plurality of chips 162, 165 may be integrated on a single package 167 or on a plurality of packages.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for chip to chip communication utilizing selectable directional antennas.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for enabling wireless communication, the method comprising:
   in a wireless device comprising a plurality of chips, wherein each of said plurality of chips comprises one or more transmitters, one or more receivers, and one or more integrated directional antennas communicatively coupled to said one or more transmitters and/or said one or more receivers:
   wirelessly communicating information between said one or more integrated directional antennas of one chip of said plurality of chips and said one or more integrated directional antennas of one or more remaining chips of said plurality of chips;
   wherein said one or more directional antennas of said one chip of said plurality of chips are selected for communication based on a direction from said one chip of said plurality of chips to said one or more remaining chips of said plurality of chips.

2. The method according to claim 1, wherein said directional antennas comprise patch antennas.

3. The method according to claim 2, comprising configuring one or more of said patch antennas on a first of said plurality of chips to transmit signals in the direction of one or more others of said plurality of chips intended to receive said transmitted signals.

4. The method according to claim 2, comprising configuring one or more of said patch antennas on a first of said plurality of chips to transmit signals at a frequency matching a configured frequency of a directional antenna integrated on one or more others of said plurality of chips intended to receive said transmitted signals.

5. The method according to claim 1, wherein said directional antennas comprise dipole antennas.

6. The method according to claim 1, comprising communicating baseband signals between said one or more integrated directional antennas of said one chip and said one or more integrated directional antennas of said one or more remaining chips.

7. The method according to claim 1, comprising communicating radio frequency signals between said one or more integrated directional antennas of said one chip and said one or more integrated directional antennas of said of one or more remaining chips.

8. The method according to claim 1, comprising communicating intermediate frequency signals between said one or more integrated directional antennas of said one chip and said one or more integrated directional antennas of said of one or more remaining chips.

9. The method according to claim 1, wherein said plurality of chips are integrated on a single package.

10. A system for enabling communication, the system comprising:
    a wireless device comprising a plurality of chips, wherein each of said plurality of chips comprise one or more transmitters, one or more receivers, and one or more integrated directional antennas communicatively coupled to said one or more transmitters and/or said one or more receivers;
    said wireless device is operable to wirelessly communicate information between said one or more integrated directional antennas of one chip of said plurality of chips and said one or more integrated directional antennas of one or more remaining chips of said plurality of chips;
    wherein said one or more directional antennas of said one chip of said plurality of chips are selected for communication based on a direction from said one chip of said plurality of chips to said one or more remaining chips of said plurality of chips.

11. The system according to claim 10, wherein said directional antennas comprise patch antennas.

12. The system according to claim 11, wherein said wireless device is operable to configure one or more of said patch antennas on a first of said plurality of chips to transmit signals in the direction of one or more others of said plurality of chips intended to receive said transmitted signals.

13. The system according to claim 11, wherein said wireless device is operable to configure one or more of said patch antennas on a first of said plurality of chips to transmit signals at a frequency matching a configured frequency of a directional antenna integrated on one or more others of said plurality of chips intended to receive said transmitted signals.

14. The system according to claim 12, wherein said directional antennas comprise dipole antennas.

15. The system according to claim 10, wherein said wireless device is operable to communicate baseband signals between said one or more integrated directional antennas of said one chip and said one or more integrated directional antennas of said of one or more remaining chips.

16. The system according to claim 10, wherein said wireless device is operable to communicate radio frequency signals between said one or more integrated directional antennas of said one chip and said one or more integrated directional antennas of said of one or more remaining chips.

17. The system according to claim 10 wherein said wireless device is operable to communicate intermediate frequency signals between said one or more integrated directional antennas of said one chip and said one or more integrated directional antennas of said of one or more remaining chips.

18. The system according to claim 10 wherein said plurality of chips are integrated on a single package.

19. The system according to claim 10, wherein said plurality of chips are integrated on a plurality of packages.

20. A system for enabling communication, the system comprising:
an electronic device operable for wireless communication, said electronic device comprising a first chip and a second chip;
said first chip comprising one or more transmitters, one or more receivers, and one or more integrated directional antennas communicatively coupled to said one or more transmitters and/or said one or more receivers in said first chip;
said second chip comprising one or more transmitters, one or more receivers, and one or more integrated directional antennas communicatively coupled to said one or more transmitters and/or said one or more receivers in said second chip;
said first chip and said second chip being operable to wirelessly communicate information between each other;
wherein said one or more directional antennas of said first chip are selected for communication based on a direction from said first chip to said second chip.

* * * * *